(12) United States Patent
Almogy et al.

(10) Patent No.: US 7,801,353 B2
(45) Date of Patent: Sep. 21, 2010

(54) METHOD FOR DEFECT DETECTION USING COMPUTER AIDED DESIGN DATA

(75) Inventors: Gilad Almogy, Kiriat Ono (IL); Benyamin Buller, Cupertino, CA (US)

(73) Assignee: Applied Materials Israel, Ltd., Rehovot (IL)

( * ) Notice: Subject to any disclaimer, the term of this patent is extended or adjusted under 35 U.S.C. 154(b) by 809 days.

(21) Appl. No.: 11/669,809

(22) Filed: Jan. 31, 2007

(65) Prior Publication Data

US 2007/0280527 A1 Dec. 6, 2007

Related U.S. Application Data

(60) Provisional application No. 60/764,517, filed on Feb. 1, 2006.

(51) Int. Cl.
*G06K 9/00* (2006.01)

(52) U.S. Cl. ........................ 382/141; 382/144; 382/145; 382/146; 382/147; 382/149; 382/150

(58) Field of Classification Search ................. 382/141, 382/144, 145, 146, 147, 149, 150
See application file for complete search history.

(56) References Cited

U.S. PATENT DOCUMENTS

| 2004/0030430 A1* | 2/2004 | Matsuoka | 700/108 |
| 2005/0104017 A1* | 5/2005 | Kimba et al. | 250/559.07 |

* cited by examiner

*Primary Examiner*—Matthew C Bella
*Assistant Examiner*—Mike Rahmjoo
(74) *Attorney, Agent, or Firm*—Sonnenschein Nath & Rosenthal LLP

(57) ABSTRACT

Images of areas of a wafer are generated and registered with respect to computer aided design (CAD) data to provide a registered images. Defects in the wafer are then detected by comparing the registered images to one another and defect location information is generated in CAD coordinates.

14 Claims, 6 Drawing Sheets

METHOD FOR DEFECT DETECTION USING COMPUTER AIDED DESIGN DATA

RELATED APPLICATIONS

This application is a non-provisional of, claims priority to and incorporates by reference U.S. Provisional Patent Application No. 60/764,517, filed 1 Feb. 2006.

FIELD OF THE INVENTION

Methods and systems for defect detection using computer aided design (CAD) data.

BACKGROUND

With the ever-shrinking sizes of circuits and devices in very large scale integrated circuits, more and more defects on the wafer are associated with lower tolerances to manufacturing errors in specific points thereon. In order to analyze defects with respect to their specific localization and layout on the die, more and more CAD data is starting to be available in the manufacturing facilities. However, due to the low accuracy of defect localization reporting by the inspection tools (on the order of 1 micron) the usefulness of this information is limited to analysis of high resolution defect review images.

Inspection tools register an image of one die to an image of another die (perform die-to-die registration) in order to perform accurate comparison which is not degraded by stage inaccuracy. Registration includes measuring an offset between the two die images and shifting one die image relative to the other die image until the two die images coincide. The accuracy of registration is very important to the full extraction of the defect detection sensitivity of the inspection tool and registration accuracy much finer than the imaging pixel were reported.

There is a need to provide highly accurate registration methods and systems.

SUMMARY OF THE INVENTION

A method for defect detection, the method includes: (i) generating a first image of a first area of an wafer; (ii) registering the first image in respect to computer aided design (CAD) data to provide a first registered image; (ii) generating a second image of a second area of an wafer; (iii) registering the second image in respect to the CAD data to provide a second registered image; (iv) detecting defects in response to a comparison between the first registered image to the second registered image; and (v) generating defect location information in CAD coordinates.

Conveniently, the first area represents an upper surface of a certain layer of the wafer and the CAD data represents a lower layer of the wafer.

Conveniently, the first area represents an upper surface of a certain layer of the wafer and the CAD data represents multiple layers of the wafer.

Conveniently, the stage of registering the first image includes: dividing the first image to multiple first image blocks; locating within each block at least one registration target; determining a first block offset between each first block and between a corresponding block represented by CAD data; and determining an offset estimate for the first image in response to multiple first block offsets.

Conveniently, the stage of registering the second image includes: dividing the second image to multiple first image blocks; locating within each block at least one registration target; determining a second block offset between each second block and between a corresponding block represented by CAD data; and determining an offset estimate for the second image in response to multiple first block offsets.

Conveniently, the stage of locating includes evaluating a quality of registration achieved by utilizing a certain first image block and selectively providing a first image block offset estimate in response to the evaluated quality of registration.

Conveniently, the stage of registering the first image includes evaluating a quality of the registration.

Conveniently, the stage of registering the first image includes: dividing a first CAD image to multiple first CAD image blocks; the first CAD image represents an expected shape of the first area; locating within each first CAD image block at least one registration target; determining a first CAD image block offset between each first CAD image block and between the first image block; and determining an offset estimate for the first image in response to multiple CAD image block offsets.

Conveniently, the stages of dividing the first CAD image and locating within each first CAD image are executed before an inspection sequence that includes the stages of generating the first image and generating the second image.

Conveniently, the stages of dividing the first CAD image and locating within each first CAD image are executed during an inspection sequence that also includes the stages of generating the first image and generating the second image.

Conveniently, the stage of generating defect location information in CAD coordinates further includes generating defect attributes.

Conveniently, the method includes generating multiple images of the first area and processing the multiple images of the first area to provide the first image of the first area.

Conveniently, the method further includes registering the second image in respect to the CAD data only if a distance between the first area and the second area exceeds a distance threshold.

A defect detection system, that includes: an imaging device adapted to acquire a first image of a first area of an wafer and a second image of a second area of the wafer; and an image processing section adapted to: register the first image in respect to computer aided design (CAD) data to provide a first registered image, register the second image in respect to the CAD data to provide a second registered image; detect defects in response to a comparison between the first registered image to the second registered image; and generate defect location information in CAD coordinates.

Conveniently, the first area represents an upper surface of a certain layer of the wafer and the image processing region is adapted to register the first image in respect to CAD data that represents a lower layer of the wafer.

Conveniently, the first area represents an upper surface of a certain layer of the wafer and the image processing region is adapted to register the first image in respect to CAD data that represents multiple layers of the wafer.

Conveniently, the image processing section is adapted to: divide the first image to multiple first image blocks; locate within each block at least one registration target; determine a first block offset between each first block and between a corresponding block represented by CAD data; and determine an offset estimate for the first image in response to multiple first block offsets.

Conveniently, the image processing section is adapted to evaluate a quality of registration achieved by utilizing a certain first image block and selectively provide a first image block offset estimate in response to the evaluated quality of registration.

Conveniently, the image processing section is adapted to evaluate a quality of the registration.

BRIEF DESCRIPTION OF THE DRAWINGS

The foregoing and other objects, features, and advantages of the present invention will become more apparent from the following detailed description when taken in conjunction with the accompanying drawings. In the drawings, similar reference characters denote similar elements throughout the different views, in which.

DETAILED DESCRIPTION

Reference will now be made in greater detail to exemplary embodiments of the present invention. In the following description made in conjunction with the exemplary embodiments of the present invention, a variety of specific elements are described. The following detailed description is of exemplary embodiments of the invention but the invention is not limited thereto, as modifications and supplemental structures may be added, as would be apparent to those skilled in the art. Also, in the following description of the present invention, a detailed description of known functions and configurations incorporated herein is omitted.

The methods and systems can be applied on various types of inspected objects including electrical circuits, marks and the like. For simplicity of explanation the following description refers to a wafer and to die to die or cell to cell comparison.

In accordance with an embodiment of the invention, defect detection based upon die to die comparison or cell to cell comparison is provided. When performing die to die defect detection the die to die registration process is replaced by die to CAD data registration processes wherein each die image is registered in respect to the CAD data. When performing cell to cell defect detection the cell to cell registration process is replaced by cell to CAD data registration processes wherein each cell image is registered in respect to the CAD data. It is noted that if the compared cells are close enough (the distance between the cells is smaller than a distance threshold) both cell images can be offset (in relation to the CDA data) by substantially the same offset and a double registration process is optional.

It is noted that the CAD data can be in various formats. For example, the CAD data can be represented by a CAD image, but this is not necessarily so. Conveniently, the CAD data includes a CAD coordinate set. The locations of defects detected by the die to die (or cell to cell) comparison are provided in CAD coordinates.

The methods and systems described below improve significantly the defect report accuracy to a level in which it is possible to point out on which specific feature a defect occurred (e.g., the specific line, contact, gap, etc.). The registration to CAD coordinates provides defect reporting accuracy that is finer than a typical feature size. For example, the registration to CAD coordinates can provide defect localization that is two orders of magnitude more accurate than current defect reporting accuracy based on die to die registration.

The methods and systems illustrated below are able to acquire an immediate understanding as to the specific feature on which the defect occurs, and to improve the productivity of a defect review tool as well as provide better classifications of pattern-dependent defects.

Figure 1:
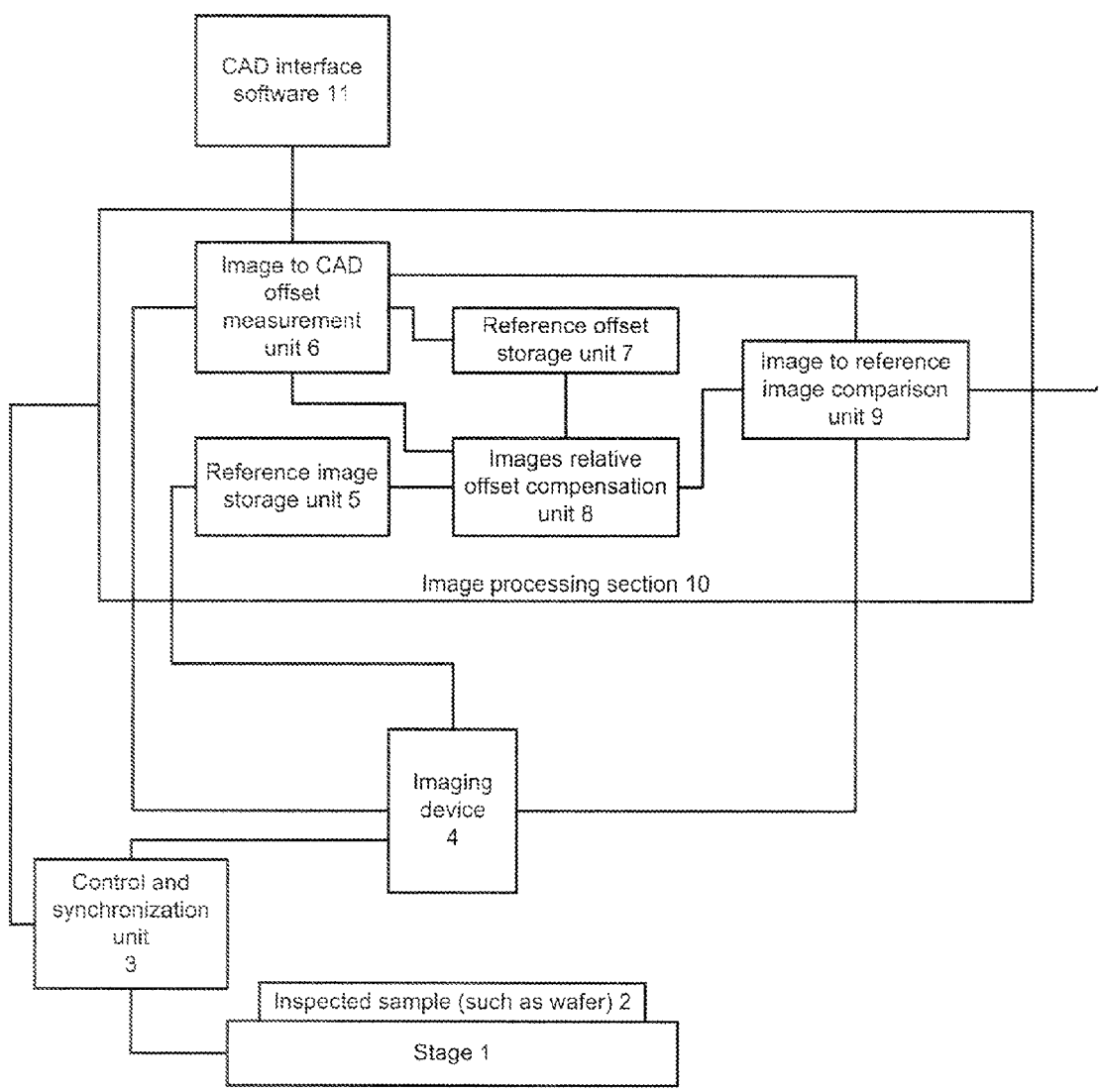
FIG. 1 illustrates a defect detection system according to an embodiment of the invention.

FIG. 1 illustrates defect detection system 20 according to an embodiment of the invention.

It is assumed, for simplicity of explanation, that defect detection system 20 detects defects by comparing: (i) information included within a first image of a first area of an inspected sample such as wafer 2, to (ii) information included within a second image of a second area of the wafer. The second image is also referred to as a reference image. The first area is a portion of the inspected object and can be, for example, a cell, a group of cells, a die, a portion of a die, multiple dice.

It is noted that the first image and the second image can be acquired by imaging device 4 of defect inspection system 20. It is further noted that each image out of the first image and the second image can be generated by acquiring multiple images and generating a synthetic image that represent the multiple acquired images. This option is also referred to as die to multi-die comparison.

Defect detection system 20 includes: stage 1, control and synchronization system 3, imaging device 4, CAD interface software 11 and image processing section 10.

Control and synchronization system 3 is connected to stage 1, imaging device 4 and image processing section 10. Conveniently, control and synchronization system 3 coordinates between the operation of these various units and components. For example, stage 1 supports an inspected sample such as wafer 2 and is adapted to mechanically translate wafer 2 through a trajectory which is set by control and synchronization system 3 that also controls imaging device 4.

Imaging device 4 can use one or more charged particle beams or one or more light (including ultraviolet and even deep ultra violet radiation) beams in order to illuminate wafer 2. It is noted that imaging device 4 can apply prior art illumination and collection techniques including bright field collection, dark field collection and the like.

Image processing section 10 includes reference image storage unit 5, image to CAD offset measurement unit 6, reference offset storage unit 7, reference image offset unit 8, and image to reference image comparison unit 9.

Imaging device 4 generates an image such as second image of a second area of wafer 2. Since wafer inspection is performed by comparing different appearances of what is expected to be the same pattern in different locations (first area, second area), the second image is therefore stored for reference in reference image storage unit 5.

The second image position relative to CAD data representative of an expected shape of the second area is measured by image to CAD offset measurement unit 6. CAD offset measurement unit 6 is also adapted to detect preferred patches for registration, as well as maintaining registration integrity thorough filtering, confidence level metering, random or preset sampling of patches or any combination of the above.

Figure 4:
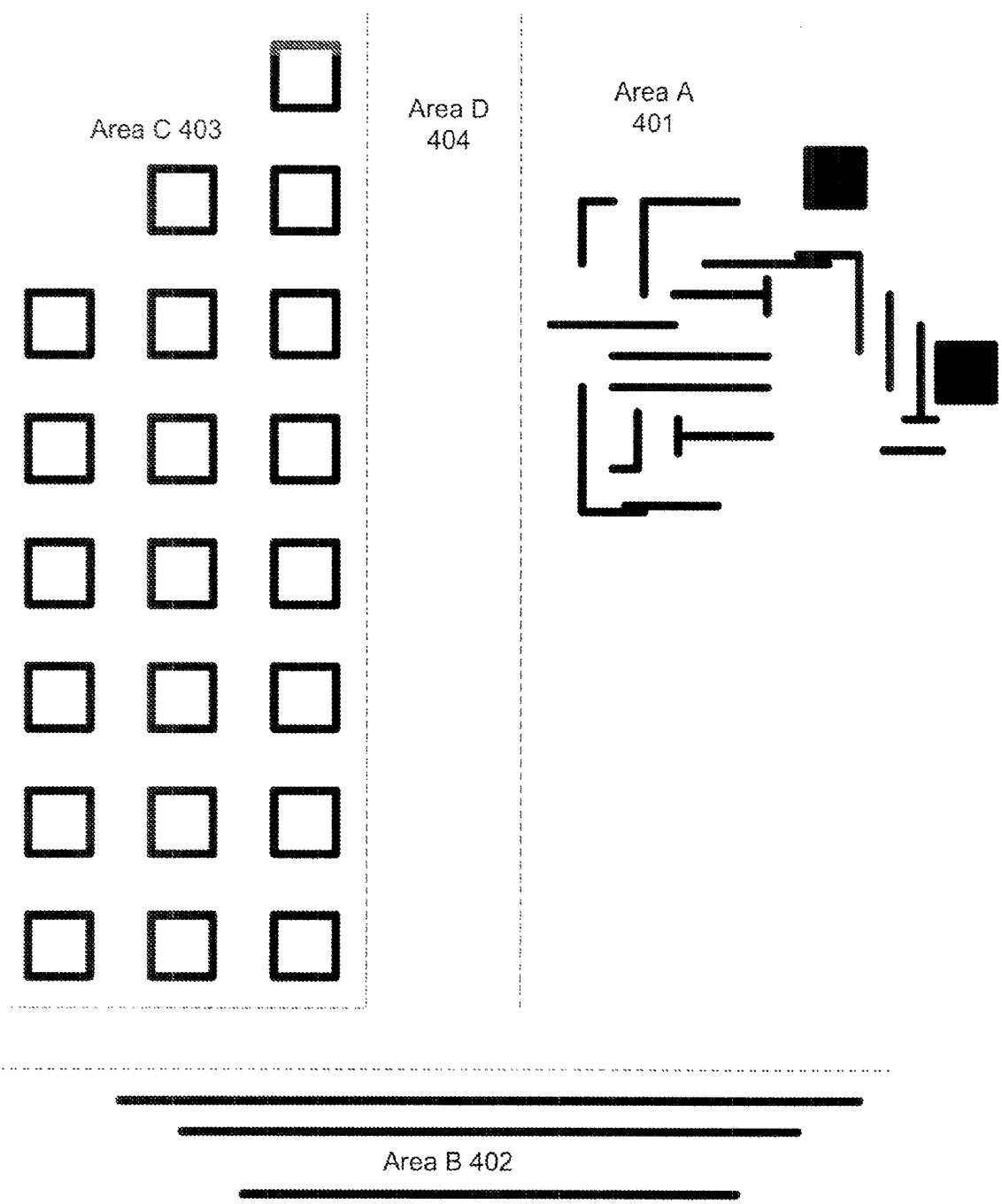
FIG. 4 illustrates multiple exemplary registration targets, according to an embodiment of the invention.

A registration target that can enable high quality registration conveniently includes unique registration targets that differ from their surroundings. Referring to FIG. 4, area A includes multiple patterns that can be selected as registration targets, area B includes horizontal lines that can not assist in determining a horizontal offset between a CAD image and between second image, area C includes a pattern which has information in both horizontal and vertical directions, however, due to the periodicity of the pattern if the offset (between the second image to the CAD image) is larger than the periodicity of the pattern it is difficult to assess many periods of the pattern the CAD image is shifted in relation to the second image. Area D includes no patterns thus it does not include any registration targets.

The offset between the second image and CAD image is stored at reference offset storage unit 7. This offset is also referred to as second offset.

Imaging device 4 acquired a first image and the offset between the CAD image and the first image is calculated by image to CAD offset measurement unit. This offset is also referred to as first offset.

The relative offset between the first and second images can be determined by comparing the first offset to the second offset and especially by calculating the difference between the first offset to the second offset.

Conveniently, the first image or second image are processed in order to compensate for the relative offset between them, by images relative offset compensation unit (also referred to as reference image offset unit) 8.

The compensated image is then compared to the other image by image to reference image comparison unit 9. If the compensated image is the first image then image to reference image comparison unit 9 compares between the second image and the compensated first image. If the compensated image is the second image then image to reference image comparison unit 9 compares between the compensated second image and the first image.

The result of the comparison can include multiple locations of defects or suspected defects. The location of the defects is conveniently represented in the CAD coordinate set. The result of the comparison can also include one or more defect attribute such as a defect signal intensity attribute.

CAD interface software 11 translates CAD data in its original CAD format to a format readable by defect inspection system 20. It can also generate the CAD image from CAD data. Yet according to another embodiment of the invention CAD interface software 11 rearranges CAD data in a more convenient way to be used by image processing section 10. It is noted that CAD interface software 11 can be a part of image processing section 10 or external to it.

Those of skill in the art will appreciate that image processing section can include one or more image processors, image processor boards, memory banks, software and hardware components.

Figure 2:
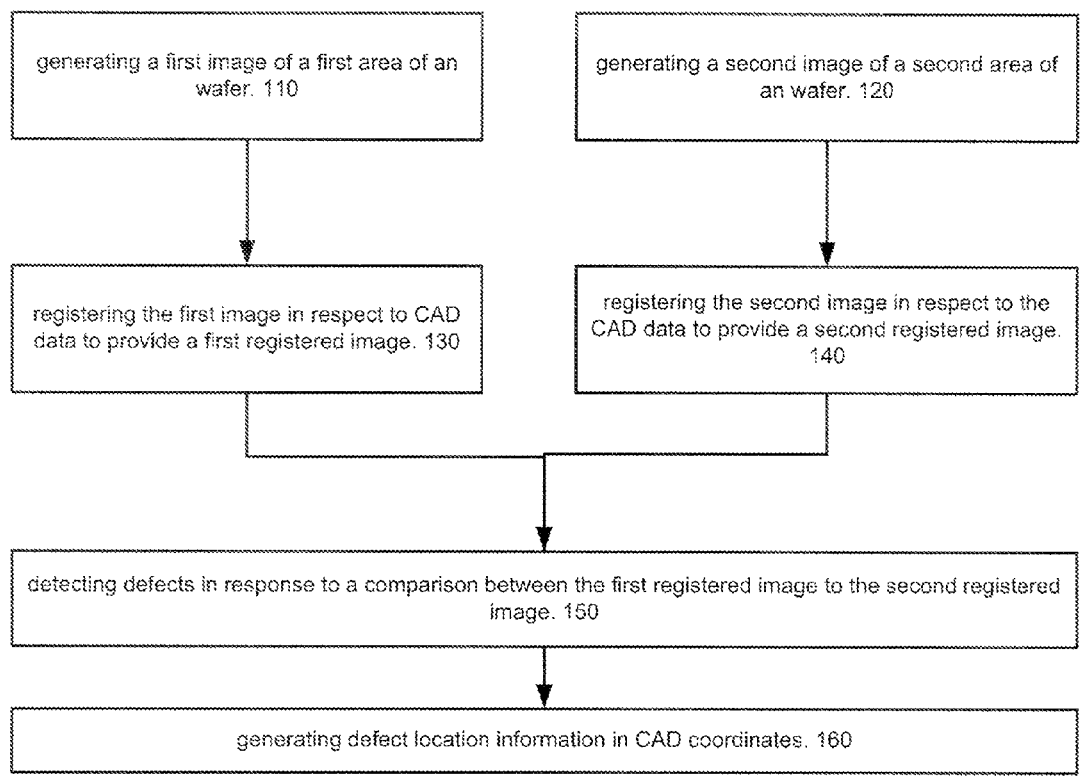
FIG. 2 is a flow chart illustrating a method for detecting defects, according to an embodiment of the invention.

FIG. 2 illustrates method 100 for defect detection, according to an embodiment of the invention.

Method 100 starts by stages 110 and 120. Stage 110 includes of generating a first image of a first area of an wafer. Stage 120 includes generating a second image of a second area of an wafer.

Referring to the example set forth in FIG. 2, imaging device 4 generates the first and second images.

Conveniently, stage 110 includes generating multiple images of the first area and processing the multiple images of the first area to provide the first image of the first area.

It is noted that stage 120 can include generating multiple images of the second area and processing the multiple images of the second area to provide the second image of the second area.

Stage 110 is followed by stage 130 of registering the first image in respect to CAD data to provide a first registered image.

Stage 120 is followed by stage 140 of registering the second image in respect to the CAD data to provide a second registered image.

Stages 130 and 140 are followed by stage 150 of detecting defects in response to a comparison between the first registered image to the second registered image.

Stage 150 is followed by stage 160 of generating defect location information in CAD coordinates.

Conveniently, stage 160 can include generating defect attributes.

Conveniently, the first area represents an upper surface of a certain layer of the wafer and wherein the CAD data represents a lower layer of the wafer, multiple layers of the wafer and the like.

According to an embodiment of the invention method 100 can be used for cell to cell comparison. Conveniently, the cell to cell comparison includes all the stages of method 100, adapted to cell to cell comparison—the first and second images are images of ideally identical cells.

According to another embodiment of the invention method 100, when performing cell to cell comparison includes registering the second image in respect to the CAD data only if a distance between the first area and the second area exceeds a distance threshold.

Figure 5:
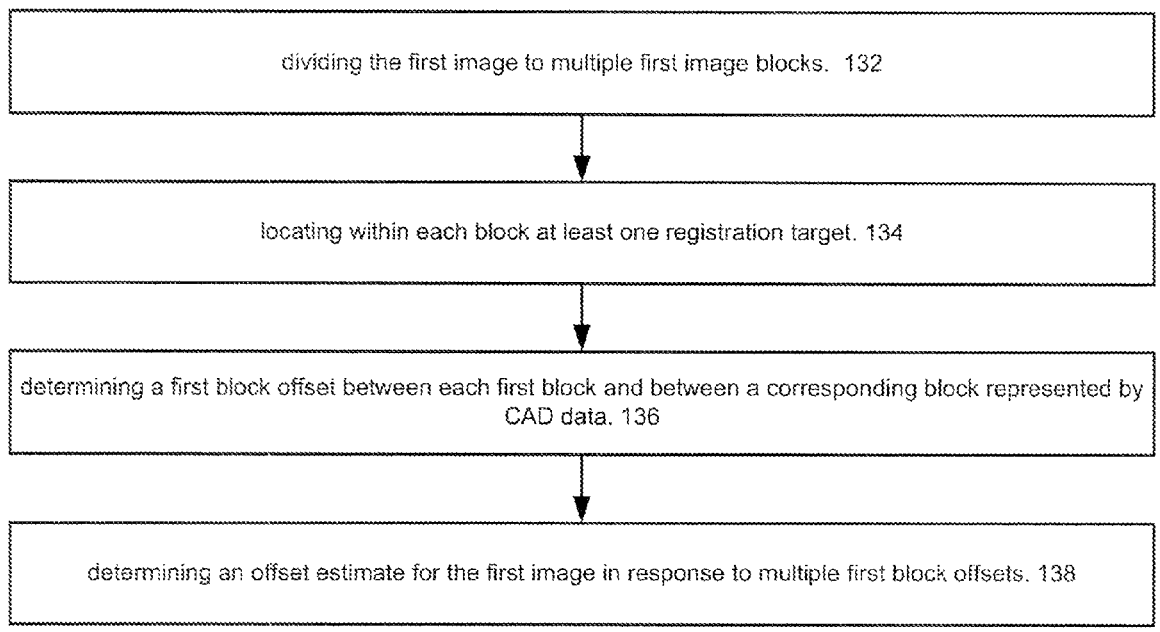
FIG. 5 illustrates a stage of registering the first image in respect to CAD data, according to an embodiment of the invention.

FIG. 5 illustrates stage 130 of registering the first image in respect to CAD data, according to an embodiment of the invention. Stage 130 includes sequence of stages 132-138.

Stage 132 includes dividing the first image to multiple first image blocks. Stage 132 is followed by stage 134 of locating within each block at least one registration target.

In each first image block, patches (registration targets) that can provide a good (of satisfactory quality level) registration can be performed are looked for (stochastically or in structured manner).

Figure 3:
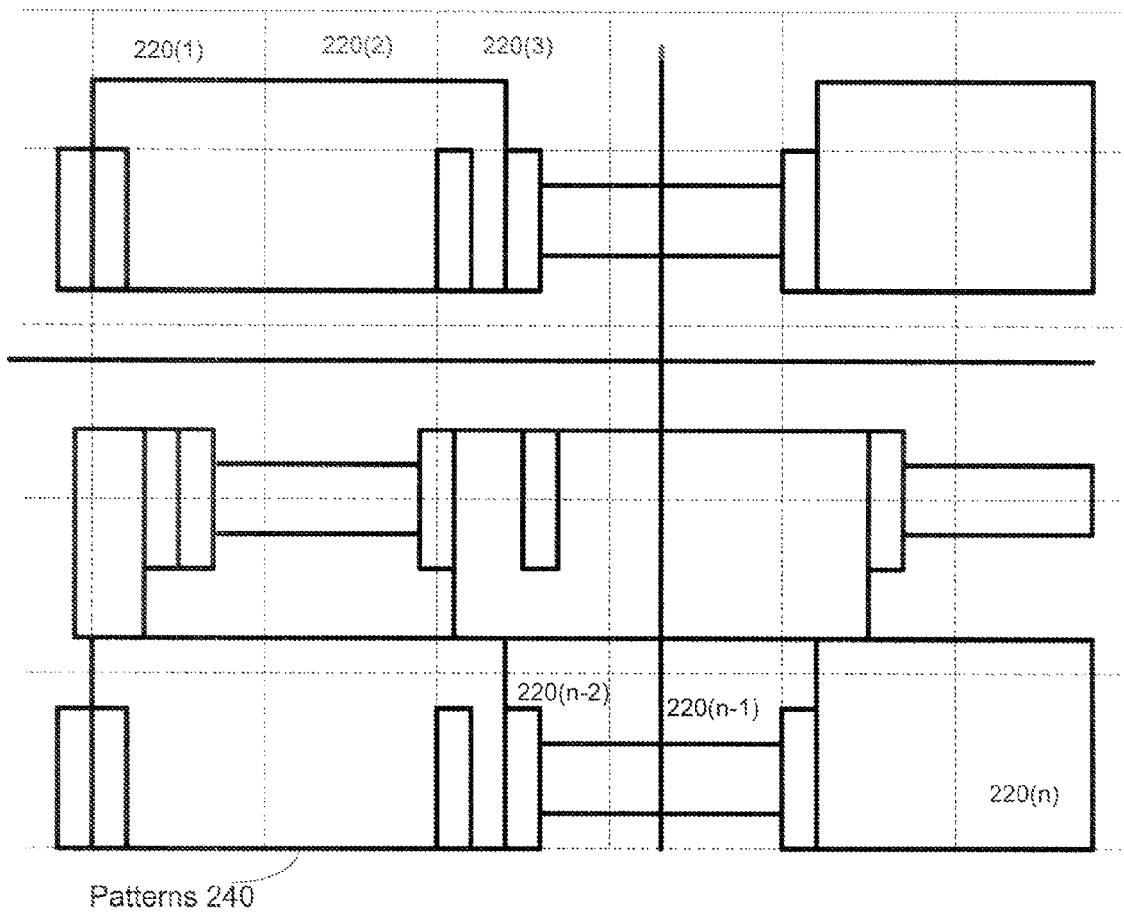
FIG. 3 illustrates an exemplary first image and multiple first image blocks, according to an embodiment an image registration.

FIG. 3 illustrates first image 210 of a first area that includes multiple patterns 240. Patterns 240 are illustrated by thick lines. First area 210 is virtually divided to multiple first image blocks 220(1)-220(n) by grid 230. In each block suitable registration targets are looked for. These patches can be processed in order to provide accurate registration.

Grid 230 is conveniently aligned with CAD coordinate grid. Each block out of 220(1)-220(n) represents a two-dimensional matrix of CAD coordinates. A location of a defect as well as a location of a patch can be provided in CAD coordinate set by or by merely stating in which first image blocks the defect or patch is positioned.

The search for good patches for registration can be performed on the CAD data or on acquired images. In particular, if the GDSII format is used, since the GDS data has multiple layers in it, it is possible to register also to CAD data that is in lower layers or in a mix of layers.

The size of the blocks is a tradeoff that can be similar to the tradeoff in choosing the die-to-die registration blocks in inspection. On one hand, defining too large blocks can result in having blocks that are characterized by non-homogenous registration errors (offsets). On the other hand defining too small blocks may increase the chance of not locating any patch within the block. The importance of the latter issue can be somewhat reduced if the result of the registration is maintained and filtered.

The accuracy of registration is important to the full extraction of the defect detection sensitivity of inspection system 10 and registration accuracy much finer than the imaging pixel can be achieved.

Stage 134 is followed by stage 136 of determining a first block offset between each first block and between a corresponding block represented by CAD data.

Stage 136 is followed by stage 138 of determining an offset estimate for the first image in response to multiple first block offsets.

It is noted that stage 140 includes equivalent stages to stage 132-138 that are applied on the second image.

Conveniently, stage 134 includes evaluating a quality of registration achieved by utilizing a certain first image block and selectively providing a first image block offset estimate in response to the evaluated quality of registration.

Conveniently, stage 130 as well as stage 140 include evaluating a quality of the registration.

Figure 6:
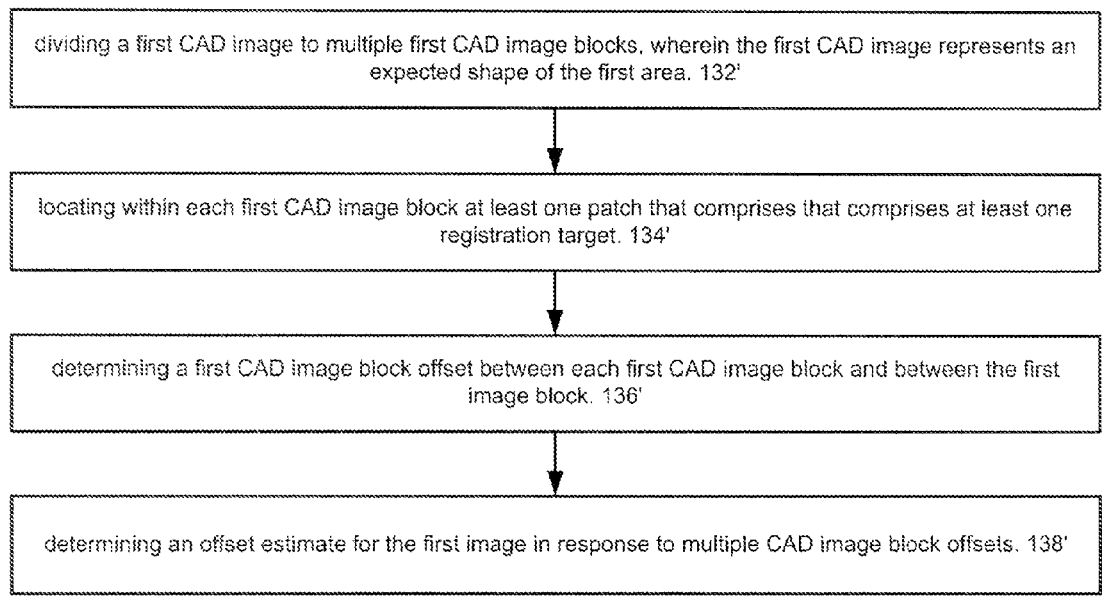
FIG. 6 illustrates a stage of registering the first image in respect to CAD data, according to another embodiment of the invention.

FIG. 6 illustrates stage 130 of registering the first image in respect to CAD data, according to another embodiment of the invention.

Stage 130 includes sequence of stages 132'-138'.

Stage 132' includes dividing a first CAD image to multiple first CAD image blocks, wherein the first CAD image represents an expected shape of the first area.

Stage 132' is followed by stage 134' of locating within each first CAD image block at least one patch that comprises that comprises at least one registration target.

Stage 134' is followed by stage 136' of determining a first CAD image block offset between each first CAD image block and between the first image block.

Stage 136' is followed by stage 138' of determining an offset estimate for the first image in response to multiple CAD image block offsets.

Stages 132' and 134' can be executed off-line, before executing an inspection sequence that includes stages 136' and 138'.

According to another embodiment of the invention stages 132' and 134' are executed in real-time, during an inspection sequence that includes stages 136' and 138'.

While this invention has been described in connection with what is presently considered to be the most practical and preferred embodiment, it is to be understood that the invention is not limited to the disclosed embodiment. Rather, it is intended to cover various modifications within the spirit and scope of the appended claims.

What is claimed is:

1. A method for defect detection, comprising:
generating a first image of a first area of an wafer;
registering the first image with respect to a computer aided design (CAD) data to provide a first registered image;
generating a second image of a second area of an wafer;
registering the second image with respect to the CAD data to provide a second registered image;
detecting defects in response to a comparison between the first registered image and the second registered image; and
generating defect location information in CAD coordinates wherein registering the first image comprises:
dividing the first image into multiple first image blocks;
locating within each of the first image blocks at least one registration target;
determining a first block offset between each of the first blocks and between a corresponding block represented by CAD data; and
determining an offset estimate for the first image in response to multiple first block offsets; wherein locating comprises:
evaluating a quality of registration achieved by utilizing a certain first image block and selectively providing a first image block offset estimate in response to the evaluated quality of registration.

2. The method according to claim 1, wherein the first area represents an upper surface of a certain layer of the wafer and the CAD data represents a lower layer of the wafer.

3. The method according to claim 1, wherein the first area represents an upper surface of a certain layer of the wafer and the CAD data represents multiple layers of the wafer.

4. The method according to claim 1, wherein the stage of registering the first image comprises evaluating a quality of the registration.

5. The method according to claim 1, wherein registering the first image comprises:
dividing a first CAD image to multiple first CAD image blocks; wherein the first CAD image represents an expected shape of the first area;
locating within each first CAD image block at least one registration target;
determining a first CAD image block offset between each first CAD image block and between the first image block; and
determining an offset estimate for the first image in response to multiple CAD image block offsets.

6. The method according to claim 5, wherein the processes of dividing the first CAD image and locating within each first CAD image are executed before an inspection sequence that comprises the stages of generating the first image and generating the second image.

7. The method according to claim 5, wherein the processes of dividing the first CAD image and locating within each first CAD image are executed during an inspection sequence that also comprises the stages of generating the first image and generating the second image.

8. The method according to claim 1, wherein generating defect location information in CAD coordinates further comprises generating defect attributes.

9. The method according to claim 1, further comprising generating multiple images of the first area and processing the multiple images of the first area to provide the first image of the first area.

10. The method according to claim 1, further comprising registering the second image in respect to the CAD data only if a distance between the first area and the second area exceeds a distance threshold.

11. A defect detection system, comprising:
an imaging device adapted to acquire a first image of a first area of an wafer and a second image of a second area of the wafer;
an image processing section adapted to:
register the first image in respect to computer aided design (CAD) data to provide a first registered image,
register the second image in respect to the CAD data to provide a second registered image; detect defects in response to a comparison between the first registered image to the second registered image; and
generate defect location information in CAD coordinates wherein the image processing section is adapted to:
divide the first image into multiple first image blocks;
locate within each of the first image blocks at least one registration target;

determine a first block offset between each of the first blocks and between a corresponding block represented by CAD data; and determine an offset estimate for the first image in response to multiple first block offsets, wherein the image processing section is adapted to evaluate a quality of registration achieved by utilizing a certain first image block and selectively provide a first image block offset estimate in response to the evaluated quality of registration.

12. The defect detection system according to claim 11, wherein the first area represents an upper surface of a certain layer of the wafer and wherein the image processing region is adapted to register the first image in respect to CAD data that represents a lower layer of the wafer.

13. The defect detection system according to claim 11, wherein the first area represents an upper surface of a certain layer of the wafer and wherein the image processing region is adapted to register the first image in respect to CAD data that represents multiple layers of the wafer.

14. The defect detection system according to claim 11, wherein the image processing section is adapted to evaluate a quality of the registration.

* * * * *